(12) United States Patent
Chiang et al.

(10) Patent No.: US 9,245,887 B2
(45) Date of Patent: Jan. 26, 2016

(54) METHOD AND LAYOUT OF AN INTEGRATED CIRCUIT

(71) Applicant: Taiwan Semiconductor Manufacturing Company, Ltd., Hsin-Chu (TW)

(72) Inventors: Ting-Wei Chiang, New Taipei (TW); Chun-Fu Chen, Chiayi (TW); Hsiang-Jen Tseng, Hsinchu (TW); Wei-Yu Chen, Hsinchu (TW); Hui-Zhong Zhuang, Kaohsiung (TW); Shang-Chih Hsieh, Yangmei (TW); Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 141 days.

(21) Appl. No.: 13/955,796

(22) Filed: Jul. 31, 2013

(65) Prior Publication Data

US 2015/0035070 A1   Feb. 5, 2015

(51) Int. Cl.
*G06F 17/50* (2006.01)
*H01L 27/092* (2006.01)
*H01L 27/02* (2006.01)
*H01L 27/088* (2006.01)
*H01L 21/8234* (2006.01)

(52) U.S. Cl.
CPC .......... *H01L 27/092* (2013.01); *H01L 27/0207* (2013.01); *H01L 27/088* (2013.01); *G06F 17/5068* (2013.01); *H01L 21/823437* (2013.01)

(58) Field of Classification Search
CPC .............. G06F 17/5068; H01L 27/092; H01L 27/0207; H01L 27/088; H01L 21/823437
See application file for complete search history.

(56) References Cited

U.S. PATENT DOCUMENTS

| | | | | |
|---|---|---|---|---|
| 2008/0169484 | A1* | 7/2008 | Chuang et al. | 257/190 |
| 2010/0052065 | A1* | 3/2010 | Diaz et al. | 257/369 |
| 2010/0269081 | A1* | 10/2010 | Hou et al. | 716/9 |
| 2011/0147765 | A1* | 6/2011 | Huang et al. | 257/77 |
| 2012/0119301 | A1* | 5/2012 | Choi et al. | 257/369 |
| 2012/0313177 | A1* | 12/2012 | Chen et al. | 257/368 |
| 2014/0062545 | A1* | 3/2014 | Dai | 327/142 |
| 2014/0103434 | A1* | 4/2014 | Lu | 257/346 |
| 2014/0124868 | A1* | 5/2014 | Kamal et al. | 257/369 |
| 2014/0239412 | A1* | 8/2014 | Yang et al. | 257/401 |

* cited by examiner

*Primary Examiner* — Nha Nguyen
(74) *Attorney, Agent, or Firm* — Slater & Matsil, L.L.P.

(57) ABSTRACT

An integrated circuit layout includes a first active region, a second active region, a first PODE (poly on OD edge), a second PODE, a first transistor and a second transistor. The first transistor, on the first active region, includes a gate electrode, a source region and a drain region. The second transistor, on the second active region, includes a gate electrode, a source region and a drain region. The first active region and the second active region are adjacent and electrically disconnected with each other. The first PODE and the second PODE are on respective adjacent edges of the first active region and the second active region. The source regions of the first and second transistor are adjacent with the first PODE and the second PODE respectively. The first PODE and the second PODE are sandwiched between source regions of the first transistor and the second transistor.

21 Claims, 6 Drawing Sheets

METHOD AND LAYOUT OF AN INTEGRATED CIRCUIT

FIELD OF DISCLOSURE

The present disclosure is related to integrated circuits and, more particularly, to layout of integrated circuits.

BACKGROUND

The trend in very-large-scale integration (VLSI) technology has resulted in narrower interconnection lines and smaller contacts. Furthermore, integrated circuit designs are becoming more complex and denser. More devices are compressed in integrated circuits to improve performance.

In the design of an integrated circuit, standard cells having predetermined functions are used. Layouts of standard cells are stored in cell libraries. When designing an integrated circuit, the respective layouts of the standard cells are retrieved from the cell libraries and placed into one or more desired locations on an integrated circuit layout. Routing is then performed to connect the standard cells with each other using interconnection tracks.

DETAILED DESCRIPTION

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

Some embodiments have one or a combination of the following features and/or advantages. An integrated circuit layout includes a first active region, a second active region, a first PODE (poly on OD edge), a second PODE, a first transistor and a second transistor. The first transistor is on the first active region, and includes a gate electrode, a source region and a drain region. The second transistor is on the second active region, and includes a gate electrode, a source region and a drain region. The first active region and the second active region are adjacent and are electrically disconnected with each other. The first PODE and the second PODE are on respective adjacent edges of the first active region and the second active region. The source region of the first transistor is adjacent with the first PODE. The source region of the second transistor is adjacent with the second PODE. The first PODE and the second PODE are sandwiched between the source region of the first transistor and the source region of the second transistor.

Figure 1:
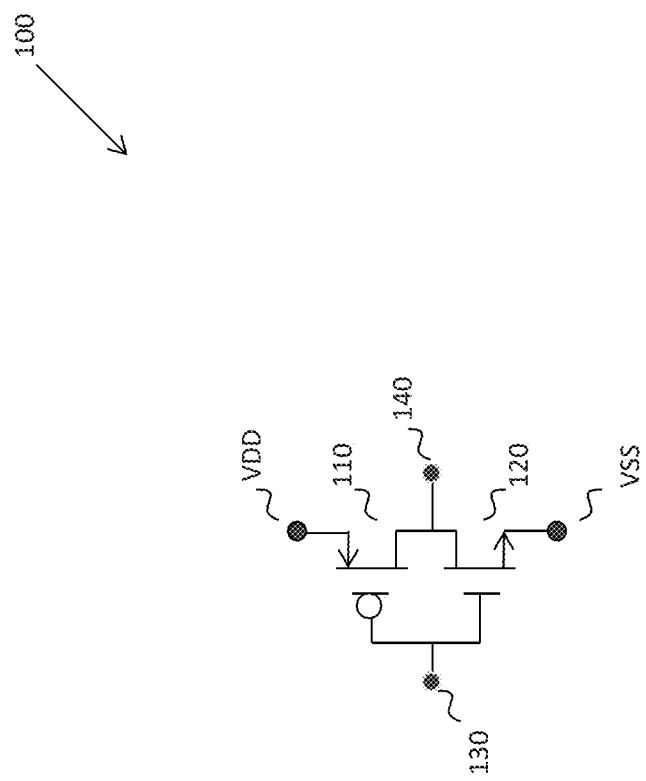
FIG. 1 is a schematic diagram of a single finger inverter gate in accordance with some embodiments.

FIG. 1 is a schematic diagram of a single finger inverter gate 100 according to some embodiments. The single finger inverter gate 100 includes a PMOS (P-channel Metal Oxide Semiconductor) transistor 110 and an NMOS (N-channel Metal Oxide Semiconductor) transistor 120. An input port 130 of the inverter gate 100 is electrically connected to gate terminals of the PMOS transistor 110 and the NMOS transistor 120. An output port 140 of the inverter gate 100 is electrically connected to drain terminals of the PMOS transistor 110 and the NMOS transistor 120.

When the input port 130 is set to "0" (for example, ground voltage), the PMOS transistor 110 is turned on and the NMOS transistor 120 is turned off. In such a situation, current flows from VDD through the PMOS transistor 110 to the output port 140. When the input port 130 is set to "1" (for example, operation voltage), the PMOS transistor 110 is turned off and the NMOS transistor 120 is turned on. In such a situation, current flows from the output port 140 through the NMOS transistor 120 to VSS.

In some embodiment, a plurality of the single finger inverter gate 100 is wired in parallel to form a multi-finger inverter gate (not shown). In such a situation, the input ports 130 of each of the plurality of the single finger inverter gate 100 are wired together. Furthermore, the output ports 140 of each of the plurality of the single finger inverter gate 100 are wired together.

Figure 2:
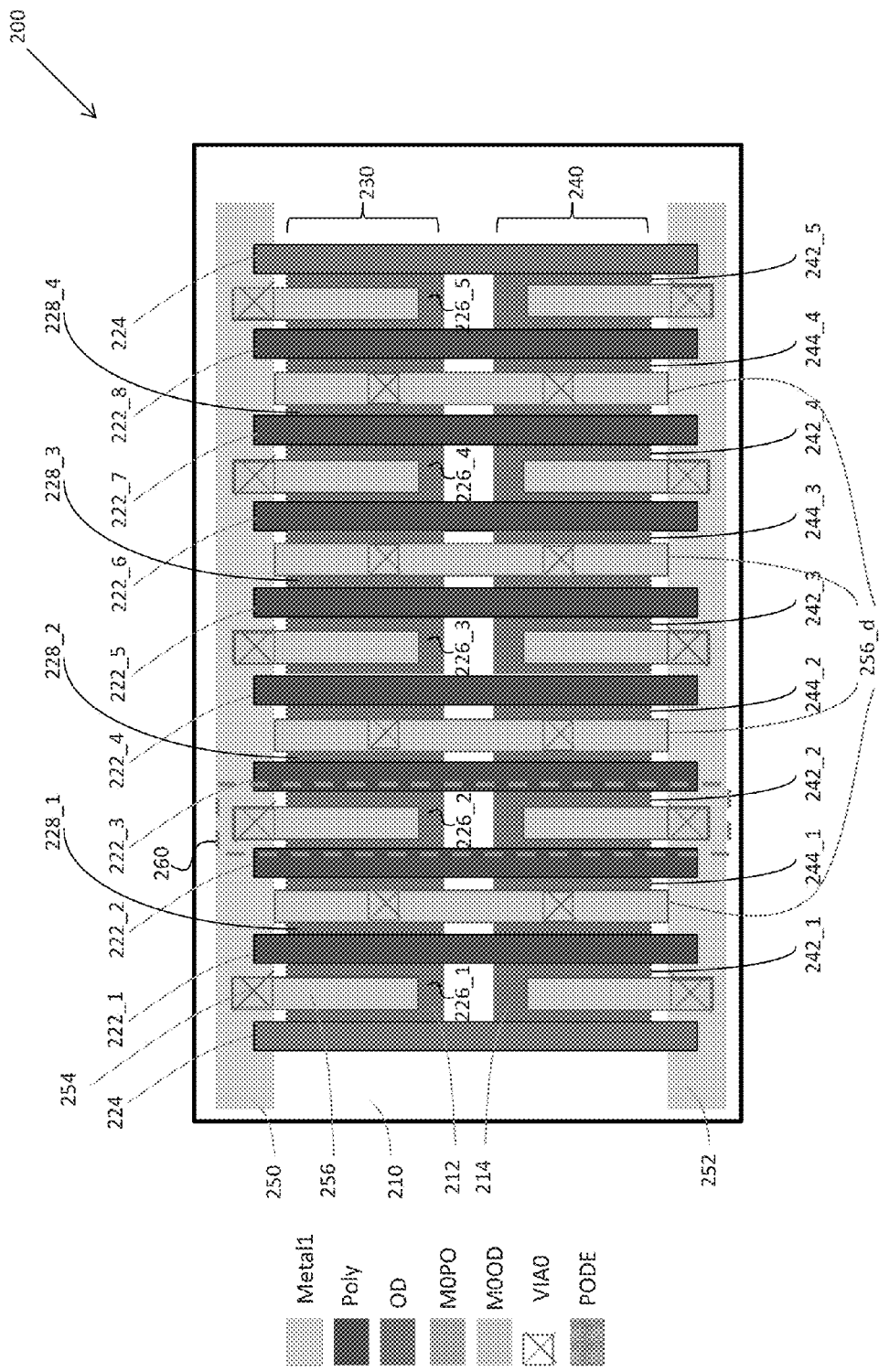
FIG. 2 is a top view of a layout illustrating a multi-finger layout example in accordance with some embodiments.

FIG. 2 is a top view of a layout 200 according to some embodiments. The layout 200 illustrates a multi-finger layout example for the multi-finger inverter gate. In FIG. 2, a semiconductor substrate, active areas, gate electrode layers and various metallic layers are overlapped. Semiconductor substrate 210 is a silicon or another suitable semiconductor substrate. P-type active region 212 and N-type active region 214 are formed within the semiconductor substrate 210. In some embodiments, an active region, such as the active regions 212 and 214, is also referred to herein as OD (oxide-dimensioned region).

Gate electrodes 222_1-222_8 and dummy gate electrodes 224 are disposed over the P-type active region 212 and N-type active region 214, and are arranged in parallel with each other and equally spaced apart. The gate electrodes 222_1-222_8 and the dummy gate electrodes 224 are formed of polysilicon or other conductive materials such as metals, metal alloys and metal silicides. The dummy gate electrodes 224 are arranged to not act as a gate to any transistor. In some embodiments, a gate electrode and a dummy gate electrode, such as the gate electrodes 222_1-222_8 and the dummy gate electrodes 224, are also referred to herein as PO. In some embodiments, the dummy gate electrodes 224 are also referred to herein as PODE (poly on OE edge).

A first transistor region 230 of the layout 200 is arranged to form PMOS transistors, such as the PMOS transistor 110 in FIG. 1. Eight PMOS transistors are formed in the first transistor region 230 of the layout 200, which is the multi-finger layout of the PMOS transistor 110 in FIG. 1. The first transistor region 230 includes an upper portion of the gate electrodes 222_1-222_8, source regions 226_1-226_5 and drain regions 228_1-228_4. Each of the source regions 226_1-226_5 and the drain regions 228_1-228_4 are formed in the P-type active region 212. Each of adjacent source regions 226_1-226_5 and drain regions 228_1-228_4 are on opposite sides of a corresponding gate electrode. In such a situation, each of the adjacent source regions 226_1-226_5, the drain regions 228_1-228_4 and a corresponding gate electrode form a PMOS transistor. For example, the source region 226_2, the drain region 228_1 and the gate electrode 222_2 form a first PMOS transistor. For another example, the source region 226_2, the drain region 228_2 and the gate electrode 222_3 form a second PMOS transistor. The first PMOS transistor and the second PMOS transistor are arranged to use the same source region 226_2. In such a situation, the source region 226_2 is also referred to as a common source of the PMOS transistors. Similarly, the source regions 226_3 and 226_4 are also referred to as common sources of PMOS transistors.

A VDD power supply line 250 is implemented, for example, in a metal one line. In some embodiments, a metal one line is referred to herein as M1. In a top-down sequence, the VDD power supply line 250 is connected through conductive via zeros 254 and conductive metal segments 256 to each of the source regions 226_1-226_5 of the corresponding PMOS transistors. In some embodiments, the conductive metal segment 256 is disposed over and is electrically coupled with one of the source regions 226_1-226_5. The conductive via zero 254 is disposed over and is electrically coupled with the conductive metal segment 256. The metal one line 250 is disposed over and is electrically coupled with the conductive via zero 254.

For illustration purposes, only one conductive via zero 254 and one conductive metal segment 256 are labeled. In some embodiments, a conductive via zero is referred to herein as VIA0. A conductive metal segment is referred to herein as M0OD.

A second transistor region 240 of the layout 200 is arranged to form NMOS transistors, such as the NMOS transistor 120 in FIG. 1. Eight NMOS transistors are formed in the second transistor region 240 of the layout 200, which is the multi-finger layout of the NMOS transistor 120 in FIG. 1. The second transistor region 240 includes a lower portion of the gate electrodes 222_1-222_8, source regions 242_1-242_5 and drain regions 244_1-244_4. Each of the source regions 242_1-242_5 and the drain regions 244_1-244_4 are formed in the N-type active region 214. Each of adjacent source regions 242_1-242_5 and drain regions 244_1-244_4 are on opposite sides of a corresponding gate electrode. In such a situation, each of the adjacent source regions 242_1-242_5, the drain regions 244_1-244_4 and a corresponding gate electrode forms an NMOS transistor. For example, the source region 242_2, the drain region 244_1 and the gate electrode 222_2 form a first NMOS transistor. For another example, the source region 242_2, the drain region 244_2 and the gate electrode 222_3 form a second NMOS transistor. The first NMOS transistor and the second NMOS transistor are arranged to use the same source region 242_2. In such a situation, the source region 242_2 is also referred to as a common source of NMOS transistors. Similarly, the source regions 242_3 and 242_4 are also referred to as common sources of the NMOS transistors.

A VSS power supply line 252 is implemented, for example, in a metal one line. In a top-down sequence, a VSS ground line 252 is connected through conductive via zeros 254 and conductive metal segments 256 to each of the source regions 242_1-242_5 of the corresponding NMOS transistors. In some embodiments, the conductive metal segment 256 is disposed over and is electrically coupled with one of the source regions 242_1-242_5.

The drain regions 228_1-228_4 of the PMOS transistors in the first transistor region 230 are electrically connected through conductive metal segments 256_d to the corresponding drain regions 244_1-244_4 of the NMOS transistors in the second transistor region 240. In some embodiments, the output port 140 of the inverter gate 100 in FIG. 1 is on a first metal one line (not shown). The first metal one line is electrically connected to each of the drain regions 228_1-228_4 of the PMOS transistors and the drain regions 244_1-244_4 of the NMOS transistors. For example, in a top-down sequence, the first metal one line is electrically connected through conductive via zeros 254 and conductive metal segments 256_*d to the drain regions* 228_1-228_4 of the PMOS transistors and the drain regions 244_1-244_4 of the NMOS transistors.

In some embodiments, the input port 130 of the inverter gate 100 in FIG. 1 is on a second metal one line (not shown). The second metal one line is electrically connected to each of the gate electrodes 222_1-222_8. For example, in a top-down sequence, the second metal one line is electrically connected through the conductive via zeros 254 and local conductive metal segments (not shown) to each of the gate electrodes 222_1-222_8. In some embodiments, the local conductive metal segments are also referred to herein as M0PO.

In some embodiments, the local conductive metal segments are disposed over and are electrically coupled with each of the gate electrodes 222_1-222_8. The heights of the local conductive metal segments plus the heights of the gate electrodes 222_1-222_8 are substantially equal to the heights of the conductive metal segment 256.

Each of the PMOS transistors formed in the first transistor region 230 of the layout 200, together with each corresponding NMOS transistor formed in the second transistor region 240 of the layout 200, form a single finger inverter gate. The multi-finger inverter gate is implemented as a plurality of single finger inverter gates wired in parallel in a multi-finger layout configuration such that a driving strength of the multi-finger inverter gate is larger than that of a single finger inverter gate.

Figure 3:
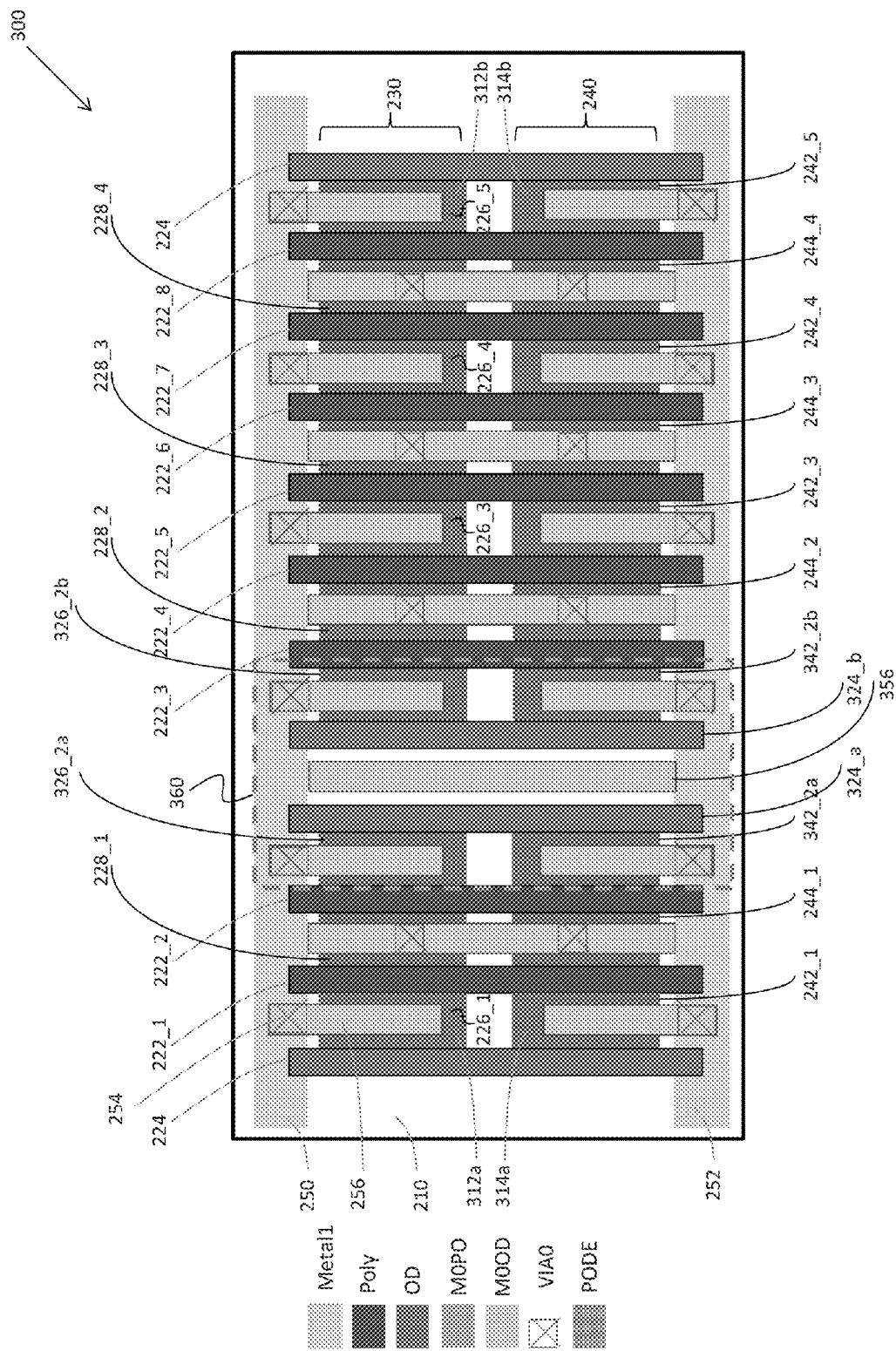
FIG. 3 is a top view of a layout in accordance with some embodiments.

FIG. 3 is a top view of a layout 300 according to some embodiments. The layout 300 includes similar components and structures as the corresponding elements in FIG. 2 except P-type OD 312a and 312b, N-type OD 314a and 314b and components in a layout region 360. The P-type OD 212 in FIG. 2 is split into two P-type OD 312a and 312b in the layout region 360. Similarly, the N-type OD 214 in FIG. 2 is split into two N-type OD 314a and 314b in the layout region 360. The common source 226_2 in a layout region 260 in FIG. 2 is split into two respective source regions 326_2a and 326_2b in the layout region 360. Moreover, the common source 242_2 in the layout region 260 is split into two respective source regions 342_2a and 342_2b in the layout region 360.

In some embodiments, a PODE 324_*a* is generated on edges of the P-type OD 312a and the N-type OD 314a in the layout region 360. Moreover, a PODE 324_*b* is generated on edges of the P-type OD 312b and the N-type OD 314b in the layout region 360. In some embodiments, a layout pattern, in which two adjacent PODEs 324_*a* and 324_*b* are sandwiched between two respective source regions 326_2a and 326_2b on respective P-type OD 312a and 312b, is also referred to herein as separated PMOS source segment. In some embodiments, a layout pattern, in which two adjacent PODEs 324_*a* and 324_*b* are sandwiched between two respective source regions 342_2a and 342_2b on respective N-type OD 314a and 314b, is also referred to herein as separated NMOS source segment. In some embodiments, a conductive metal segment 356 is generated between the PODE 324_*a* and the PODE 324_*b*. In some embodiments, the conductive metal segment 356 is split into two separated conductive metal segments. Although FIG. 3 only shows one conductive interconnection in M0OD between the PODE 324_*a* and the PODE 324_*b*, any number of conductive interconnections in other layers is within the scope of various embodiments.

In some embodiments, the separated PMOS source segment is aligned with the separated NMOS source segment. In such a situation, the source region 326_2a of the separated PMOS source segment is aligned with the source region 342_2a of the separated NMOS source segment in X coordinate. Moreover, the source region 326_2b of the separated PMOS source segment is aligned with the source region 342_2b of the separated NMOS source segment in X coordinate.

In some embodiments, a layout includes at least one separated PMOS source segment and at least one common source of PMOS transistors. In some embodiments, a layout includes at least one separated NMOS source segment and at least one common source of NMOS transistors. In some embodiments, a layout includes one of a separated PMOS source segment and a common source of PMOS transistors. In some embodiments, a layout includes one of a separated NMOS source segment and a common source of NMOS transistors.

In some embodiments, a layout includes at least one separated PMOS source segment and at least one separated NMOS source segment. In some embodiments, a count of separated PMOS source segments in a layout is equal to a count of separated NMOS source segments in the layout. In some embodiments, a count of separated PMOS source segments in a layout is larger than a count of separated NMOS source segments in the layout. In some embodiments, a count of separated PMOS source segments in a layout is smaller than a count of separated NMOS source segments in the layout. In some embodiments, a layout includes one of separated PMOS source segments and separated NMOS source segments.

In some embodiments, a length of long axis of one of the P-type OD 312a and 312b is at least three times larger than a distance between the PODE 324_a and the PODE 324_b. In some embodiments, a length of long axis of one of the N-type OD 314a and 314b is at least three times larger than a distance between the PODE 324_a and the PODE 324_b.

Figure 4:
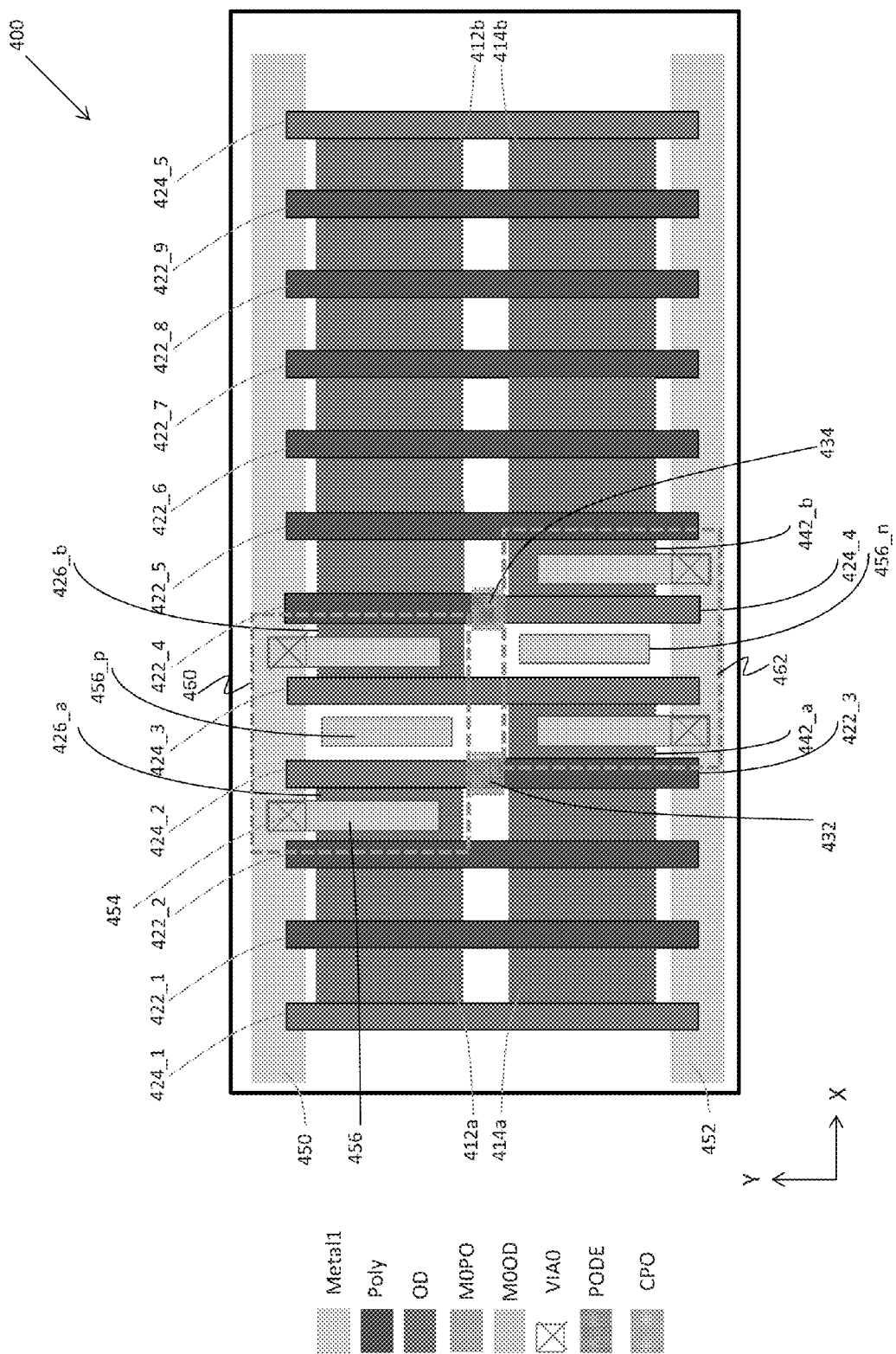
FIG. 4 is a top view of a layout in accordance with some embodiments.

FIG. 4 is a top view of a layout 400 according to some embodiments. The layout 400 includes P-type OD 412a, 412b and N-type OD 414a, 414b. Gate electrodes 422_1-422_9 and PODE 424_1-424_5 are disposed over the respective P-type OD 412a, 412b and/or respective N-type OD 414a, 414b. Moreover, a poly cut (CPO) 432 is arranged to form in between the PODE 424_2 and the gate electrode 422_3 to physically disconnect the PODE 424_2 and the gate electrode 422_3. Similarly, a CPO 434 is arranged to form in between the gate electrode 422_4 and the PODE 424_4 to physically disconnect the gate electrode 422_4 and the PODE 424_4.

A layout region 460 includes two adjacent PODE 424_2, 424_3 and two source regions 426_a, 426_b on respective P-type OD 412a and 412b. The PODE 424_2 and 424_3 are sandwiched between the source regions 426_a and 426_b to form a separated PMOS source segment. Similarly, a layout region 462 includes two adjacent PODE 424_3, 424_4 and two source regions 442_a, 442_b on respective N-type OD 414a and 414b. The PODE 424_3 and 424_4 are sandwiched between the source regions 442_a and 442_b to form a separated NMOS source segment.

In some embodiments, the separated PMOS source segment 460 is misaligned with the separated NMOS source segment 462. In such a situation, the source region 426_a of the separated PMOS source segment 460 is not aligned with the source region 442_a of the separated NMOS source segment 462 in X coordinate. Moreover, the source region 426_b of the separated PMOS source segment 460 is not aligned with the source region 442_b of the separated NMOS source segment 462 in X coordinate.

In some embodiments, a length of long axis of one of the P-type OD 412a and 412b is at least three times larger than a distance between the PODE 424_2 and the PODE 424_3. In some embodiments, a length of long axis of one of the N-type OD 414a and 414b is at least three times larger than a distance between the PODE 424_3 and the PODE 424_4.

Figure 5:
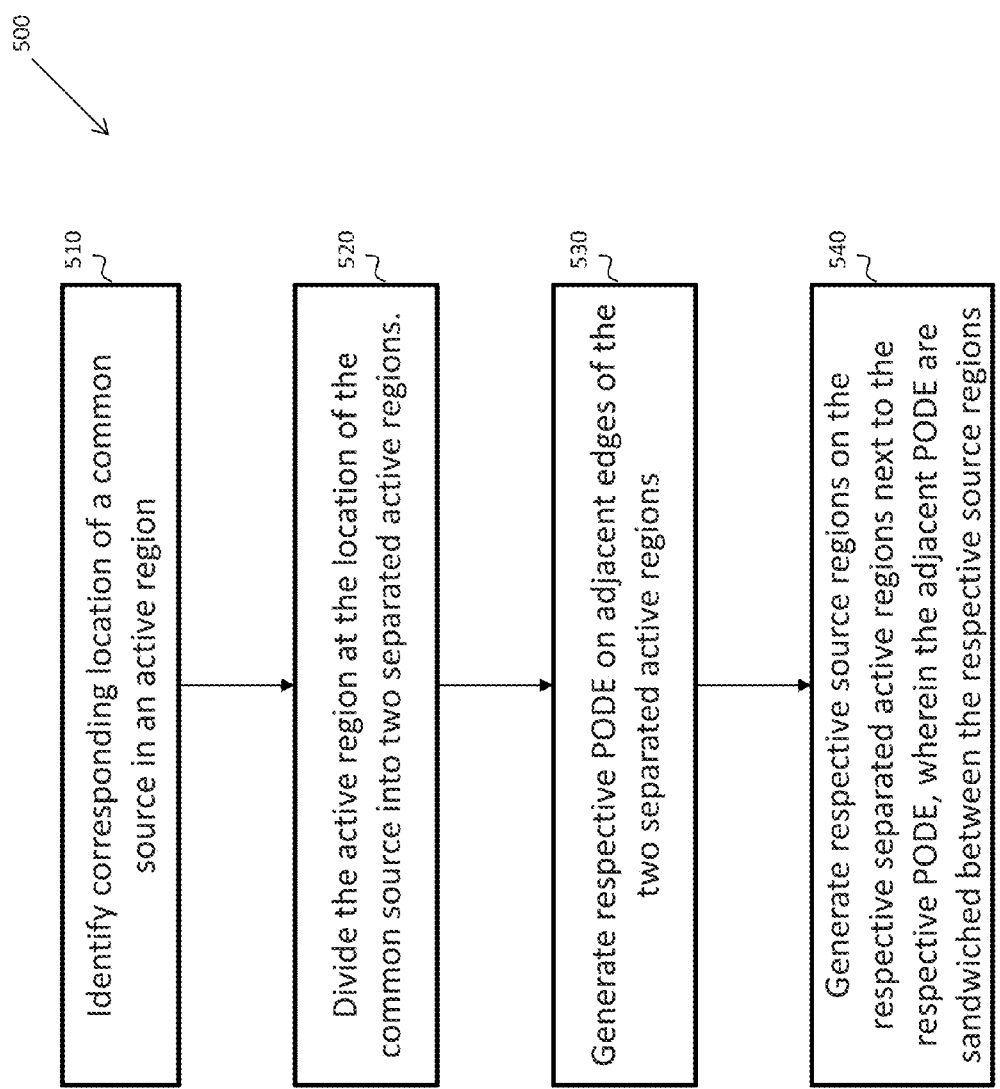
FIG. 5 is a flow chart of a layout method of the inverter gate in FIGS. 1, 2, 3 and 4 in accordance with some embodiments.

FIG. 5 is a flow chart 500 of a layout method of the inverter gate 100 in FIGS. 1, 2, 3 and 4 according to some example embodiments.

In operation 510, corresponding location of a common source is identified in an active region. For example, in FIG. 2, the source region 226_2, the drain region 228_1 and the gate electrode 222_2 form a first PMOS transistor. Furthermore, the source region 226_2, the drain region 228_2 and the gate electrode 222_3 form a second PMOS transistor. The first PMOS transistor and the second PMOS transistor are arranged to use the same source region 226_2. In such a situation, the source region 226_2 is identified as a common source of the first PMOS transistor and the second PMOS transistor.

For another example, in FIG. 2, the source region 242_2, the drain region 244_1 and the gate electrode 222_2 form a first NMOS transistor. Furthermore, the source region 242_2, the drain region 244_2 and the gate electrode 222_3 form a second NMOS transistor. The first NMOS transistor and the second NMOS transistor are arranged to use the same source region 242_2. In such a situation, the source region 242_2 is identified as a common source of the first NMOS transistor and the second NMOS transistor.

In operation 520, the active region at the location of the common source is divided into two separated active regions. For example, at layout region 360 in FIG. 3, the P-type OD 212 at a location of the common source 226_2 in FIG. 2 is divided into two separated P-type OD 312a and 312b. For another example, the N-type OD 214 at a location of the common source 242_2 in FIG. 2 is divided into two separated N-type OD 314a and 314b.

In operation 530, respective PODE are generated on adjacent edges of the two separated active regions. For example, PODE 324_a and 324_b are generated on adjacent edges of the respective P-type OD 312a and 312_b in FIG. 3. For another example, PODE 324_a and 324_b are also generated on adjacent edges of the respective N-type OD 314a and 314_b. The two PODE 324_a and 324_b are adjacent with each other.

In operation 540, respective source regions are generated on the respective separated active regions next to the respective PODE, wherein the adjacent PODE are sandwiched between the respective source regions. For example, in FIG. 3, the source regions 326_2a and 326_2b are generated on the respective P-type OD 312a and 312b next to the respective PODE 324_a and 324_b. In such a situation, the PODE 324_a and 324_b are sandwiched between the respective source regions 326_2a and 326_2b. For another example, the source regions 342_2a and 342_2b are generated on the respective N-type OD 314a and 314b next to the respective PODE 324_a and 324_b. In such a situation, the PODE 324_a and 324_b are sandwiched between the respective source regions 342_2a and 342_2b.

Figure 6:
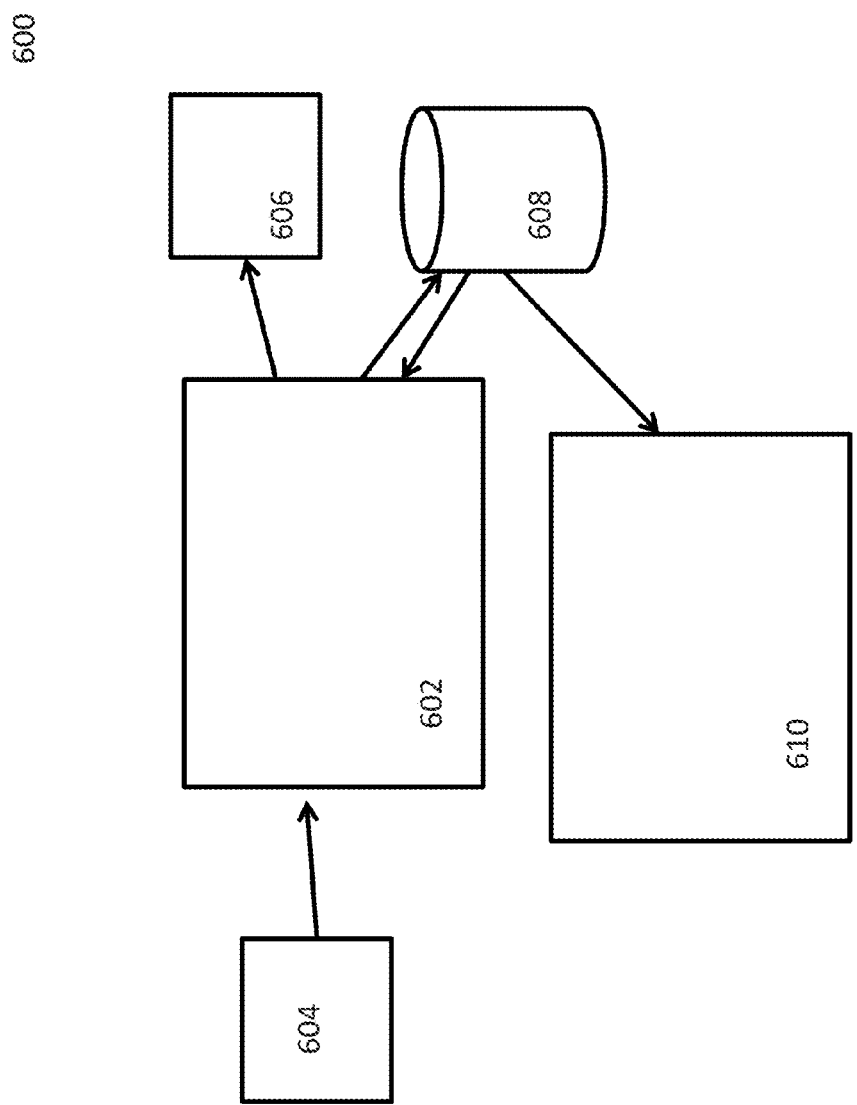
FIG. 6 illustrates a processing system wherein the above described method may be implemented in order to generate one or more of the above described layout embodiments.

FIG. 6 illustrates a processing system 600 wherein the above described method may be implemented in order to generate one or more of the above described layout embodiments. Processing system 600 includes a processor 602, which may include a central processing unit, input/output circuitry, signal processing circuitry, and volatile and/or non-volatile memory. Processor 602 receives input, such as user input, from input device 604. Input device may include one or more of a keyboard, a mouse, a tablet, a contact sensitive surface, a stylus, a microphone, and the like. Processor 602 may also receive input, such as standard cell layouts, cell libraries, models, and the like, from machine readable permanent storage medium 608. Machine readable permanent storage medium may be located locally to processor 602, or may be remote from processor 602, in which case communications between processor 602 and machine readable permanent storage medium occur over a network, such as a telephone network, the Internet, a local area network, wide area network, or the like. Machine readable permanent storage medium may include one or more of a hard disk, magnetic storage, optical storage, non-volatile memory storage, and the like. Included in machine readable permanent storage medium may be database software for organizing data and instructions stored on machine readable permanent storage medium 608. Processing system 600 may include output device 606, such as one or more of a display device, speaker, and the like for outputting information to a user. As described above, processor 602 generates a layout for an integrated circuit. The layout may be stored in machine readable permanent storage medium 608. One or more integrated circuit manufacturing machines, such as a photomask generator 610 may communicate with machine readable permanent storage medium 608, either locally or over a network, either directly or via an intermediate processor such as processor 602. In one embodiment, photomask generator generates one or more photomasks to be used in the manufacture of an integrated circuit, in conformance with a layout stored in machine readable permanent storage medium 608.

In some embodiments, an integrated circuit layout includes a first active region, a second active region, a first PODE (poly on OD edge), a second PODE, a first transistor and a second transistor. The first transistor is on the first active region, and includes a gate electrode, a source region and a drain region. The second transistor is on the second active region, and includes a gate electrode, a source region and a drain region. The first active region and the second active region are adjacent and are electrically disconnected with each other. The first PODE and the second PODE are on respective adjacent edges of the first active region and the second active region. The source region of the first transistor is adjacent with the first PODE. The source region of the second transistor is adjacent with the second PODE. The first PODE and the second PODE are sandwiched between the source region of the first transistor and the source region of the second transistor.

In some embodiments, a cell layout includes a first P-type active region, a second P-type active region, a first N-type active region and a second N-type active region. The first P-type active region and the second P-type active region are adjacent and are disconnected with each other. The first N-type active region and the second N-type active region are adjacent and are disconnected with each other. The cell layout further includes a first PMOS transistor, a second PMOS transistor, a first NMOS transistor and a second NMOS transistor. The first PMOS transistor and the second PMOS transistor are on the first P-type active region and the second P-type active region respectively. The first NMOS transistor and the second NMOS transistor are on the first N-type active region and the second N-type active region respectively. A first pair of PODE (poly on OD edge) is on respective adjacent edges of the first P-type active region and the second P-type active region. A second pair of PODE is on respective adjacent edges of the first N-type active region and the second N-type active region. The first pair of PODE is sandwiched between respective sources regions of the first PMOS transistor and the second PMOS transistor to form a separated PMOS source segment. The second pair of PODE is sandwiched between respective sources regions of the first NMOS transistor and the second NMOS transistor to form a separated NMOS source segment.

In some embodiments, a method of configuring an integrated circuit layout includes dividing an active region at a location of a common source into two separated active regions. The method also includes generating respective PODE on adjacent edges of the two separated active regions. The method further includes generating respective source regions on the respective separated active regions next to the respective PODE, wherein the adjacent PODE are sandwiched between the respective source regions.

The sequences of the operations in the flow chart 500 are used for illustration purpose. Moreover, the sequences of the operations in the flow chart 500 can be changed. Some operations in the flow chart 500 can be skipped, and/or other operations can be added without limiting the scope of claims appended herewith.

While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. An integrated circuit, comprising:
a first active region and a second active region;
a first PODE (poly on OD edge) and a second PODE;
a first transistor, on the first active region, including a gate electrode, a source region and a drain region; and
a second transistor, on the second active region, including a gate electrode, a source region and a drain region;
wherein
the first active region and the second active region are adjacent and are electrically disconnected with each other;
the first PODE and the second PODE are on respective adjacent edges of the first active region and the second active region;
the source region of the first transistor is adjacent the first PODE;
the source region of the second transistor is adjacent the second PODE;
the first PODE and the second PODE are sandwiched between the source region of the first transistor and the source region of the second transistor; and
at least one conductive interconnection is located between the first PODE and the second PODE.

2. The integrated circuit of claim 1, wherein the first active region and the second active region are P-type active regions.

3. The integrated circuit of claim 2, further comprising a third PMOS transistor and a fourth PMOS transistor on one of the first active region and the second active region; wherein the third PMOS transistor and the fourth PMOS transistor are adjacent each other and share a common source region.

4. The integrated circuit of claim 1, wherein the first active region and the second active region are N-type active regions.

5. The integrated circuit of claim 4, further comprising a third NMOS transistor and a fourth NMOS transistor on one of the first active region and the second active region; wherein the third NMOS transistor and the fourth NMOS transistor are adjacent with each other and share a common source region.

6. The integrated circuit of claim 1, wherein a length of long axis of one of the first active region and the second active region is at least three times larger than a distance between the first PODE and the second PODE.

7. A cell, comprising:
a first P-type active region and a second P-type active region are adjacent and are disconnected with each other;
a first N-type active region and a second N-type active region are adjacent and are disconnected with each other;
a first PMOS transistor and a second PMOS transistor; and
a first NMOS transistor and a second NMOS transistor;
wherein
the first PMOS transistor and the second PMOS transistor are on the first P-type active region and the second P-type active region respectively;
the first NMOS transistor and the second NMOS transistor are on the first N-type active region and the second N-type active region respectively;
a first pair of PODE (poly on OD edge) is on respective adjacent edges of the first P-type active region and the second P-type active region;
a second pair of PODE is on respective adjacent edges of the first N-type active region and the second N-type active region;
the first pair of PODE is sandwiched between respective sources regions of the first PMOS transistor and the second PMOS transistor to form a separated PMOS source segment; and
the second pair of PODE is sandwiched between respective sources regions of the first NMOS transistor and the second NMOS transistor to form a separated NMOS source segment.

8. The cell of claim 7, wherein at least one conductive interconnection is arranged to locate in between the first pair of PODE.

9. The cell of claim 7, wherein at least one conductive interconnection is arranged to locate in between the second pair of PODE.

10. The cell of claim 7, wherein the separated PMOS source segment and the separated NMOS source segment are aligned with each other.

11. The cell of claim 7, wherein the separated PMOS source segment and the separated NMOS source segment are misaligned with each other.

12. The cell of claim 7, further comprising a third PMOS transistor and a fourth PMOS transistor on one of the first P-type active region and the second P-type active region; wherein the third PMOS transistor and the fourth PMOS transistor are adjacent with each other and share a common source region.

13. The cell of claim 7, further comprising a third NMOS transistor and a fourth NMOS transistor on one of the first N-type active region and the second N-type active region; wherein the third NMOS transistor and the fourth NMOS transistor are adjacent with each other and share a common source region.

14. The cell of claim 7, wherein one of the first pair of PODE is electrically connected to respective one of the second pair of PODE.

15. The cell of claim 7, wherein a length of long axis of one of the first P-type active region and the second P-type active region is at least three times larger than a distance between the first pair of PODE.

16. The cell of claim 7, wherein a length of long axis of one of the first N-type active region and the second N-type active region is at least three times larger than a distance between the second pair of PODE.

17. An integrated circuit, comprising:
a first active region and a second active region, the first active region having a first edge proximal the second active region and a second edge distal the second active region, the second active region having a first edge proximal the first active region and a second edge distal the first active region;
an isolation region interjacent and electrically isolating the first and second active regions;
a first polysilicon dummy gate overlying the first edge of the first active region and overlying a source region of a first transistor formed in the first active region;
a second polysilicon dummy gate overlying the first edge of the second active region and overlying a source of a second transistor formed in the second active region; and
at least one conductive interconnection is located between the first polysilicon dummy gate and the second polysilicon dummy gate.

18. The integrated circuit of claim 17, further comprising:
a third active region and a fourth active region, the third active region having a first edge proximal the fourth active region and a second edge distal the second active region, the fourth active region having a first edge proximal the third active region and a second edge distal the third active region;
the isolation region being interjacent and electrically isolating the third and fourth active regions and being interjacent the first and third active regions, and being interjacent the second and fourth active regions;
the first polysilicon dummy gate overlying the first edge of the third active region and overlying a source region of a third transistor formed in the third active region; and
the second polysilicon dummy gate overlying the first edge of the fourth active region and overlying a source of a fourth transistor formed in the fourth active region.

19. The integrated circuit of claim 18 wherein the first and third transistors are p-type transistors and the second and fourth transistors are n-type transistors.

20. An integrated circuit, comprising:
a first active region and a second active region, wherein the first active region and the second active region are P-type active regions;
a first PODE (poly on OD edge) and a second PODE;
a first transistor, on the first active region, including a gate electrode, a source region and a drain region;
a second transistor, on the second active region, including a gate electrode, a source region and a drain region;
a third PMOS transistor and a fourth PMOS transistor on one of the first active region and the second active region, wherein the third PMOS transistor and the fourth PMOS transistor are adjacent each other and share a common source region;
wherein
the first active region and the second active region are adjacent and are electrically disconnected with each other;
the first PODE and the second PODE are on respective adjacent edges of the first active region and the second active region;
the source region of the first transistor is adjacent the first PODE;
the source region of the second transistor is adjacent the second PODE; and the first PODE and the second PODE are sandwiched between the source region of the first transistor and the source region of the second transistor.

21. The integrated circuit of claim 20, wherein a length of long axis of one of the first active region and the second active region is at least three times larger than a distance between the first PODE and the second PODE.

* * * * *